United States Patent
Doyle

(10) Patent No.: US 10,073,514 B2
(45) Date of Patent: Sep. 11, 2018

(54) SINGLE CONVERSION POWER DISTRIBUTION FOR COMPUTING DEVICE ARRANGEMENTS

(71) Applicant: T-Mobile USA, Inc., Bellevue, WA (US)

(72) Inventor: Donley Bryan Doyle, Plano, TX (US)

(73) Assignee: T-Mobile USA, Inc., Bellevue, WA (US)

(*) Notice: Subject to any disclaimer, the term of this patent is extended or adjusted under 35 U.S.C. 154(b) by 85 days.

(21) Appl. No.: 15/090,246

(22) Filed: Apr. 4, 2016

(65) Prior Publication Data

US 2016/0313784 A1 Oct. 27, 2016

Related U.S. Application Data

(60) Provisional application No. 62/152,646, filed on Apr. 24, 2015.

(51) Int. Cl.
| | |
|---|---|
| *G06F 1/26* | (2006.01) |
| *G06F 1/32* | (2006.01) |
| *H05K 7/14* | (2006.01) |
| *G06F 13/42* | (2006.01) |
| *G06F 13/40* | (2006.01) |

(52) U.S. Cl.
CPC .......... *G06F 1/3296* (2013.01); *G06F 1/3212* (2013.01); *G06F 13/4081* (2013.01); *G06F 13/4282* (2013.01); *H05K 7/1492* (2013.01)

(58) Field of Classification Search
CPC ............ G06F 13/4081; G06F 13/4282; G06F 1/3212; G06F 1/3296; G06F 1/26
See application file for complete search history.

(56) References Cited

U.S. PATENT DOCUMENTS

| | | | | |
|---|---|---|---|---|
| 2011/0304211 | A1* | 12/2011 | Peterson ................. | G06F 1/263 307/48 |
| 2012/0020349 | A1* | 1/2012 | Dunwoody ........... | G06F 15/161 370/351 |
| 2015/0295389 | A1* | 10/2015 | Steeves ................. | H02B 1/205 361/624 |

* cited by examiner

*Primary Examiner* — Fahmida Rahman
(74) *Attorney, Agent, or Firm* — Lee & Hayes, PLLC

(57) ABSTRACT

A server arrangement wherein 480 volt alternating current voltage is converted to a direct current voltage in a single step. The server arrangement includes a plurality of cabinets configured with a plurality of rack units, wherein each rack unit is configured to accept a component. The server arrangement further includes a plurality of components located within the rack units. A plurality of power buses are located above the plurality of cabinets and are electrically coupled to cabinets within rows of cabinets. The server arrangement also includes a plurality of rectifier units. Each rectifier unit is configured to convert 480 volt alternating current voltage to a direct current voltage to supply to one or more components.

18 Claims, 5 Drawing Sheets

SINGLE CONVERSION POWER DISTRIBUTION FOR COMPUTING DEVICE ARRANGEMENTS

CROSS-REFERENCE TO RELATED APPLICATIONS

The present disclosure claims priority to U.S. Provisional Patent Application No 62/152,646, filed Apr. 24, 2015, the entire disclosure of which is hereby incorporated by reference in its entirety.

BACKGROUND

In recent years, telecommunication devices have advanced from offering simple voice calling services within wireless networks to providing users with many new features. Telecommunication devices now provide messaging services such as email, text messaging, and instant messaging; data services such as Internet browsing; media services such as storing and playing a library of favorite songs; location services; and many others. In addition to the new features provided by the telecommunication devices, users of such telecommunication devices have greatly increased. Such increase in users is only expected to continue and in fact, it is expected that there could be a growth rate of twenty times more users in the next few years alone.

With the ever-increasing large number of features and ever-increasing large number of users, it is important to provide service for the users within wireless networks. Thus, larger numbers of computing devices, such as, for example, servers, are required to provide the features and handle the number of users. Servers are becoming more powerful even as their size decreases. Additionally, the power requirements for the required servers will continue to increase. As equipment power density requirements continue to increase, it is necessary to find higher capacity power distribution methods to support modern equipment. Such power distribution methods often involve multiple power conversion steps. However, each voltage conversion step may increase complexity, equipment space requirements and cost, while decreasing reliability and efficiency. Thus far, power density has been improved with much smaller power conversion units and alternative battery technologies but a continuation of power density increases is projected that will exceed existing design limitations.

BRIEF DESCRIPTION OF THE DRAWINGS

The detailed description is set forth with reference to the accompanying figures, in which the left-most digit of a reference number identifies the figure in which the reference number first appears. The use of the same reference numbers in different figures indicates similar or identical items or features.

DETAILED DESCRIPTION

Figure 1A:
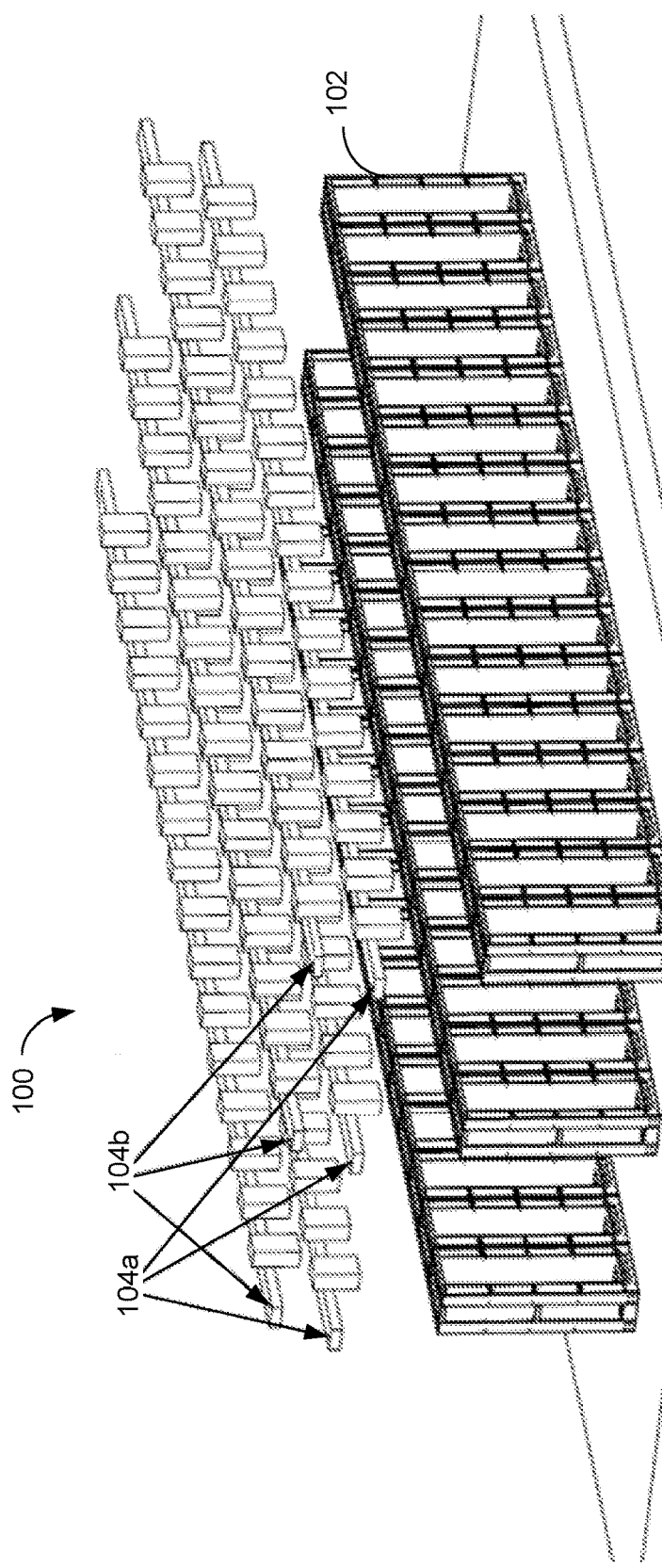
FIG. 1A schematically illustrates a server arrangement that functions as a computing system, in accordance with various embodiments.

Described herein is a computing device, e.g., server, arrangement that includes architecture and methods for single-conversion power distribution to the servers within the arrangement. In general, the server arrangement includes a plurality of server cabinets that house the servers, where each server cabinet includes a plurality of rack units (RU) generally in the form of slots to receive the servers (or some other component). Such a server arrangement functions as a computing system.

Almost all modern servers and routers use a single voltage power rail that delivers power to the server cabinets. Most server manufacturers provide many power input options for the servers and routers but the power supplies within the server cabinets simply convert whatever the office distribution power is to a single voltage for the common power rail. This power rail voltage is typically 12 volt direct current (12V DC) in equipment used today. Power supplied to the server cabinets is generally 480V three phase (480V3Φ) power, which is an alternating current (AC) power. Thus, the power must be converted to the desired 12V DC power (or whatever power is needed by the components in the server cabinets), which generally requires multiple conversions.

In embodiments disclosed herein, 480V3Φ power may safely be distributed to each cabinet using overhead power buses. A vertical space outside the server racks within the server cabinets may be used to house one or more 480V 3Φ to 12V DC power conversion assemblies in the form of one or more rectifier units. The vertical power distribution has 100 amperes (A) power connection terminals at each RU that provide enough ampacity for up to 960 W to each RU. The terminals may be coupled together to support a multi-RU server chassis with higher power requirements. This eliminates the need for the power supply within each server/router chassis that is required to reach the single-conversion goal. In embodiments, the total cabinet capacity is 45 kW (with a 2n+1 redundant rectifier unit arrangement) per 52 RU server cabinet.

In embodiments, power delivery to all server cabinets in the arrangement is via redundant 480V 3Φ power buses. Power connection from the bus to each server cabinet may be made with flexible cables terminated with twist lock connectors. This may substantially reduce the cable and conduit bulk of underfloor power whips. The resulting congestion reduction improves subfloor airflow and may reduce a subfloor clear-height design requirement for the server cabinets.

In embodiments, one or more batteries may be included in the vertical space outside the server racks to provide temporary power for the servers during a power outage until a power generator may be activated to provide power. In other embodiments, a large, single battery may be located along a wall of a room that houses the server arrangement or outside a building that includes the room that houses the server arrangement. The large single battery may be used to provide temporary power for the servers during a power outage until a power generator may be activated to provide power.

FIG. 1A illustrates a server arrangement 100 that functions as a computing system. The server arrangement 100 comprises three rows of server cabinets 102, where each server cabinet 102 is configured to receive a plurality of servers (not illustrated). While FIG. 1 illustrates three rows of server cabinets 102, in embodiments, more or fewer rows of server cabinets 102 can be included. The server arrangement 102 includes a plurality of power buses 104a, 104b that are located on top of the server cabinets 102 and coupled to the server cabinets 102 as will be described in more detail herein.

Figure 1B:
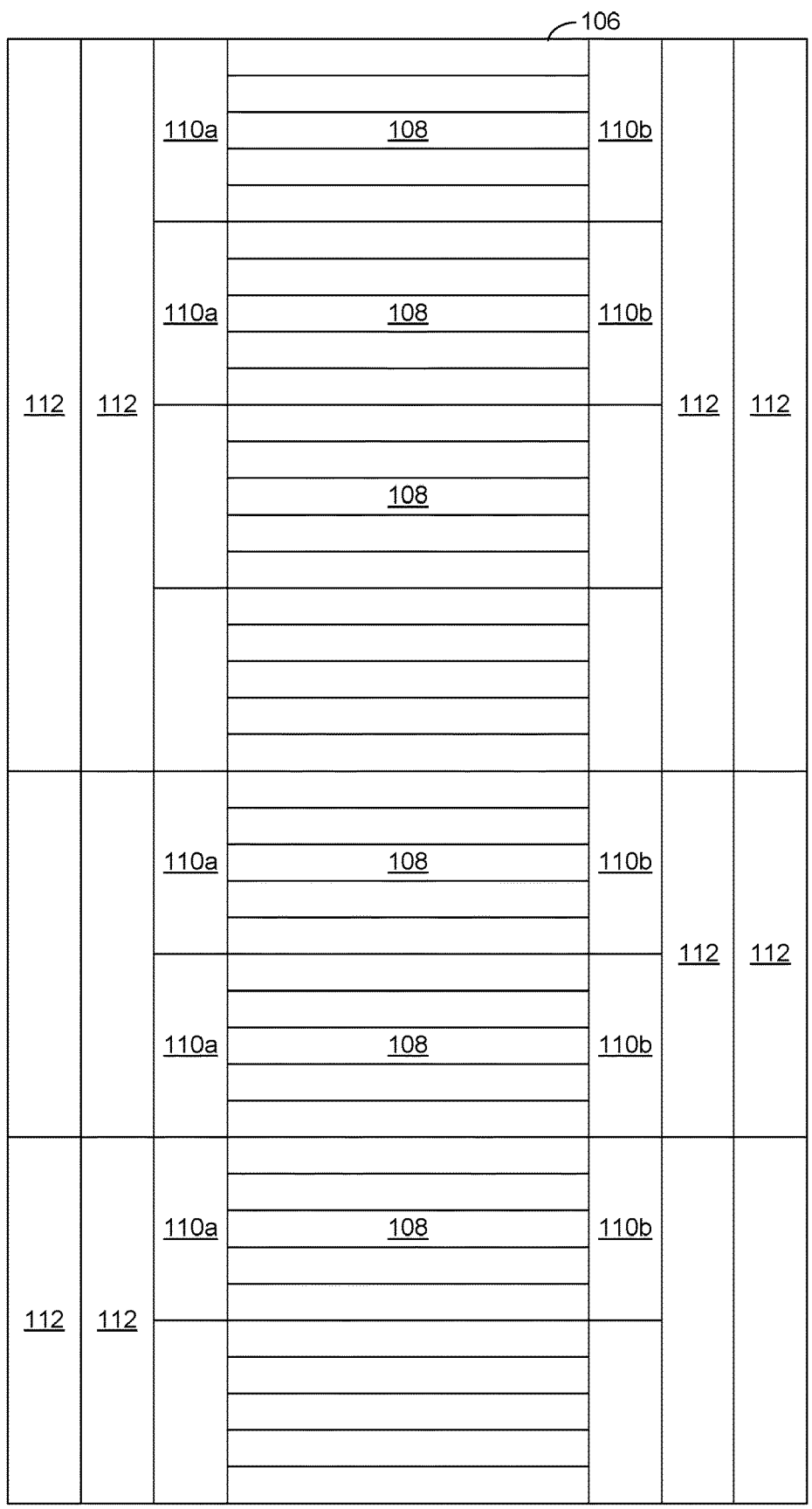
FIG. 1B schematically illustrates a front few of a server cabinet of the server arrangement of FIG. 1A, in accordance with various embodiments.

FIG. 1B illustrates a front few of a server cabinet 102. The server cabinet 102 is essentially a rack that includes a plurality of slots 106, generally referred to as rack units (RU). Each RU 106 is configured to receive a server 108, or some other component such as, for example, a router. In embodiments, one or more of the RUs 106 are configured to receive multiple components. The routers are included within the cabinet to route signals among various servers 108 and between the various server cabinets 102. Such cabinets, servers, routers, as well as other components included within such a server arrangement, and the various connections are generally well known and thus, will not be further described herein.

Each side of the server cabinet 102 includes one or more rectifier units 110a, 110b in a vertical space outside the RUs 106. The rectifier units 110a, 110b are along each side of the server cabinet 102 in order to provide a 2n+1 redundant power supply for the servers 108. In embodiments, batteries 112 are also included in the vertical space outside the RUs 106 in order to provide back-up power for the servers 108. The rectifier units 110a, 110b receive 480V3Φ power from the power buses 104a, 104b, respectively, and convert the power to 12 volt DC power to supply to the servers 108 and other components within the server cabinet 102. In embodiments, the rectifier units 110a, 110b are configured to convert the 480V3Φ power to other forms of power for the servers 108 (or other components) based upon the requirements of the servers 108. For example, the rectifier units 110a, 110b may be configured to provide 24V DC power, −48V DC power, etc. In embodiments, there may be two rows of batteries 112 included in the vertical space outside the RUs 106. In other embodiments, there may only be a single row of batteries 112 included in the vertical space outside the RUs 106.

Figure 2:
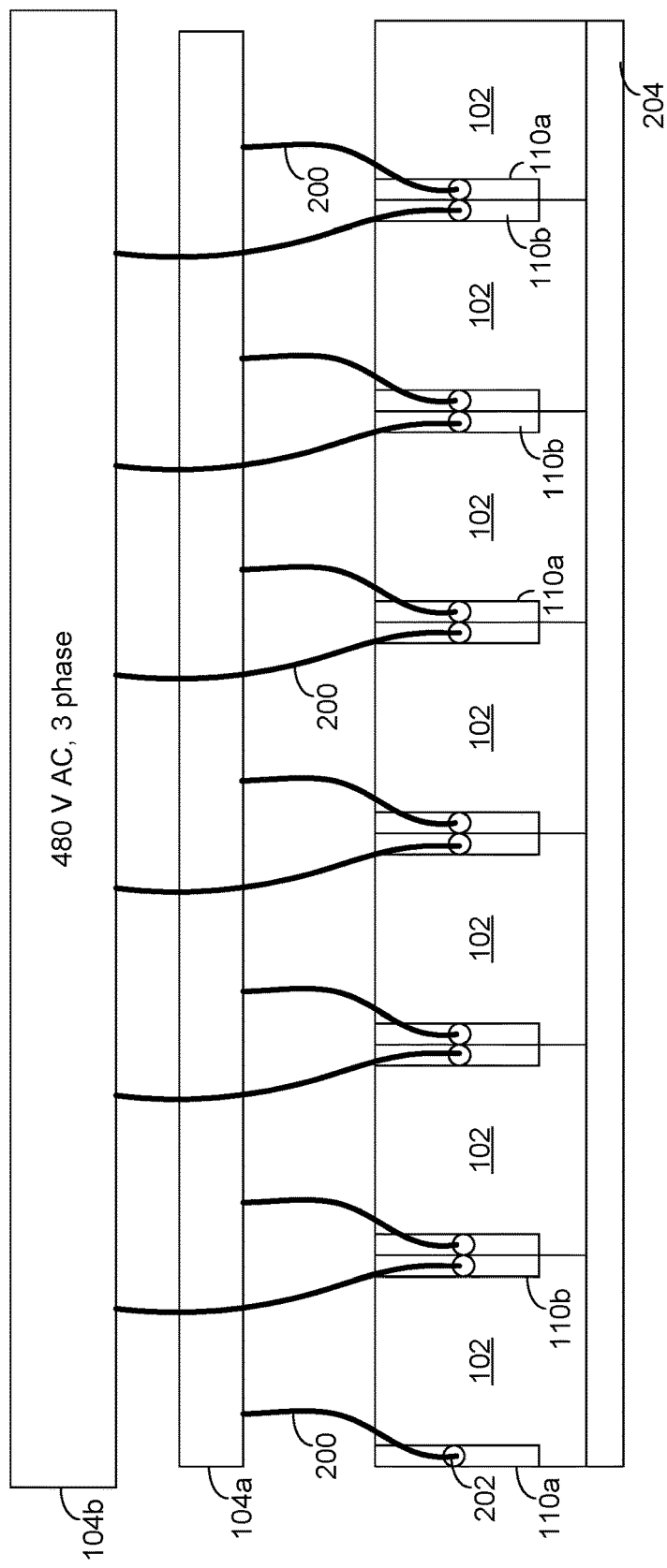
FIG. 2 schematically illustrates a coupling power buses to server cabinets of the server arrangement of FIG. 1A, in accordance with various embodiments.

Referring to FIG. 2, 480V 3Φ power is provided from the overhead power buses 104a, 104b to the columns of one or more rectifier units 110a, 110b via wires 200. In embodiments, the wires 200 extend from the power buses 104a, 104b into protector units 202, i.e., circuit breakers or fuses, at the top of each column of rectifier units 110a, 110b. The wires 200 can be coupled to the protector units 202 utilizing twist cable technology, which is generally safe for virtually all personnel. Accordingly, exposed power wires 202 are avoided.

In embodiments, there are 52 RUs 106 in each server cabinet 102 and thus each cabinet can house a total of 52 servers 108 or other components. Thus, 52 rectifier units 110 are located on each side of the server 102, e.g., 52 rectifier units 110a on one side and 52 rectifier units 110b on the other side for a total of 104 rectifier units 110, with a pair of each of the 104 rectifier units 110 corresponding to a particular server 108. Thus, each server 108 has a corresponding rectifier unit 110 on each side within the server cabinet 102 to provide a redundant power supply to the servers 108.

As previously noted, batteries 112 are provided to provide power to the servers 108 in case of interruption of power from the 480V 3Φ power supply. The batteries 112 are generally sized large enough to allow for 30 seconds to up to four minutes of power supply for the servers 108 until a generator unit (not illustrated) can be activated to once again provide 480V 3Φ power during the power interruption. Examples of battery size include batteries of 54 volts. One or two columns of 54 volt batteries may be included adjacent to the columns of rectifier units 110 on each side of the server cabinet 102. Thus during a power interruption, the batteries 112 will supply 54 volt power to the rectifier units 110, which will convert the power from the batteries 112 into the necessary power form for the servers 108, e.g., 12V DC, 24V DC, −48V DC, etc.

In embodiments, a large, single battery (not illustrated) may be located along a wall or on a wall in a room housing the server arrangement 100 and away from the server arrangement 100, instead of including batteries 112 in the server cabinets 102. The single battery may alternatively be located outside a building that includes the room that houses the server arrangement 100. For example, a large battery may provide 540 volts of power to the server arrangement 100 during an interruption of power from the 480V 3Φ power supply. Such a large battery can allow for up to four to eight hours of power during such a power interruption. Once again, the power can be routed from the single battery to the rectifier units 110, where the rectifier units 110 will convert the received power to needed power for the servers 108.

Generally, cables, wires and other components for traditional server cabinet arrangements are located beneath the server cabinets. Since the wires 200 are located above the server cabinets 102 and are coupled to the power buses 104a, 104b, this may substantially reduce the cable and conduit bulk of underfloor power whips. The resulting congestion reduction improves subfloor airflow and may reduce a subfloor clear-height design requirement for the server cabinets 102. In embodiments, an evaporative cooler 204 may be provided under the server cabinets 102 to provide additional cooling for the components of the server cabinets 102.

Figure 3:
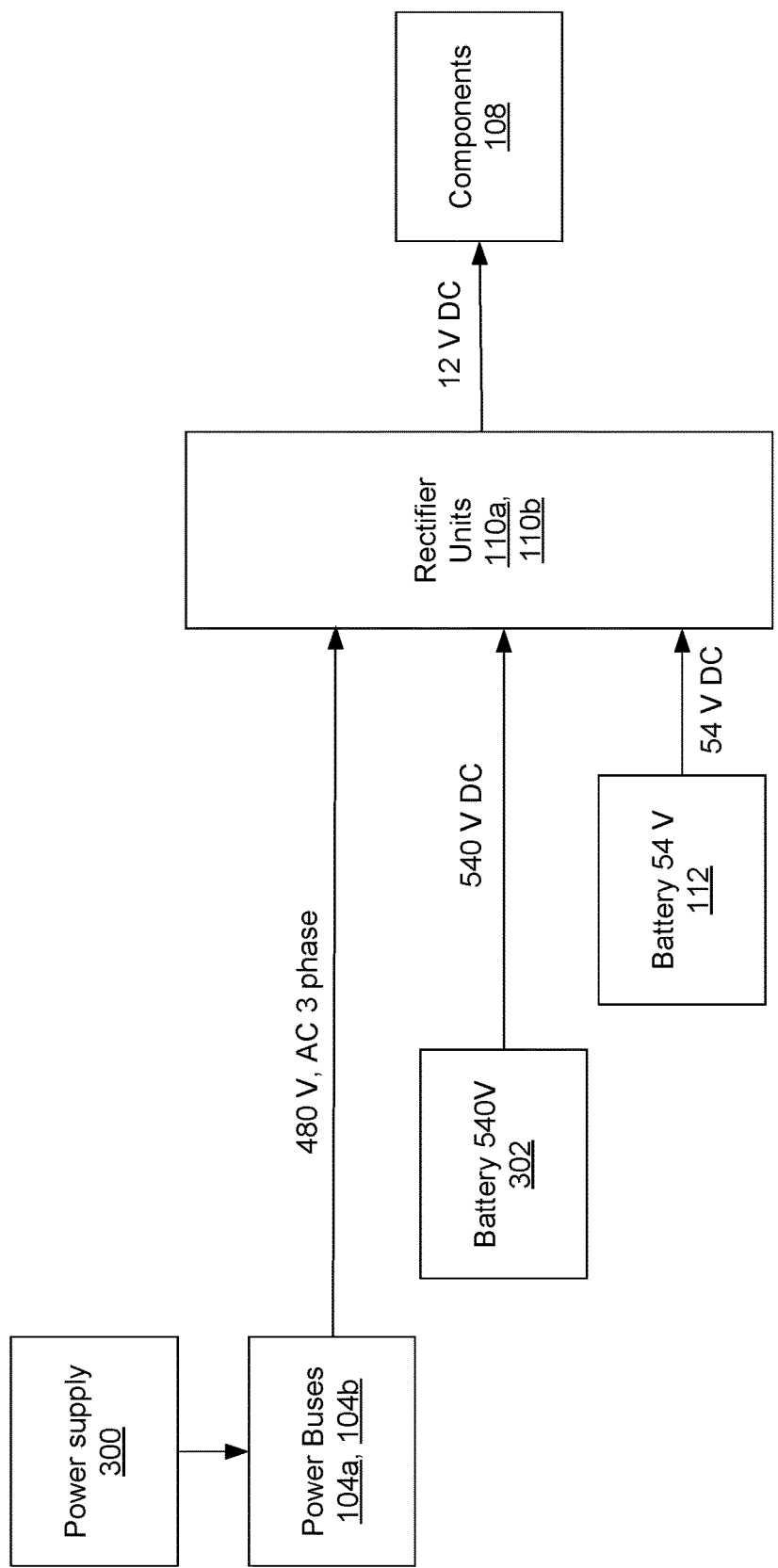
FIG. 3 schematically illustrates delivery of power to components within the server cabinets of the server arrangement of FIG. 1A, in accordance with various embodiments.

Referring to FIG. 3, an example of delivery of power to the components (e.g. servers 108) within the server cabinets 102 may be described. A power supply 300 distributes 480V 3Φ power to the overhead power buses 104a, 104b. The power buses distribute the 480V 3Φ power to the rectifier units 110a, 110b. The vertical power distribution has 100 amperes (A) power connection terminals at each RU 106 that provide enough ampacity for up to 960 W to each RU 106. In embodiments, the total cabinet capacity is 45 kW (with a 2n+1 redundant rectifier unit arrangement) per 52 RU server cabinet. Thus, power delivery to all server cabinets 102 in the arrangement 100 is via redundant 480V 3Φ power buses 104a, 104b. The 480V 3Φ power is converted by the rectifier units 110a, 110b into a required power for the servers 108 (or other components) in the RUs 106, e.g., 12V DC.

In an embodiment, one or more batteries 112 may be included in the server cabinets 102, e.g., the vertical space outside the RUs 106, to provide temporary power to the rectifier units 110a, 110b for the servers 108 during a power outage until a power generator (not illustrated) may be activated to provide 480V 3Φ power. In embodiments, the batteries 112 are 54V DC. In other embodiments, a large, single battery 302 may be located along a wall of a room that houses the server arrangement or outside a building that includes the room that houses the server arrangement. The large single battery may be used to provide temporary power to the rectifier units 110a, 110b for the servers 108 during a power outage until a power generator (not illustrated) may be activated to provide 480V 3Φ power.

Figure 4:
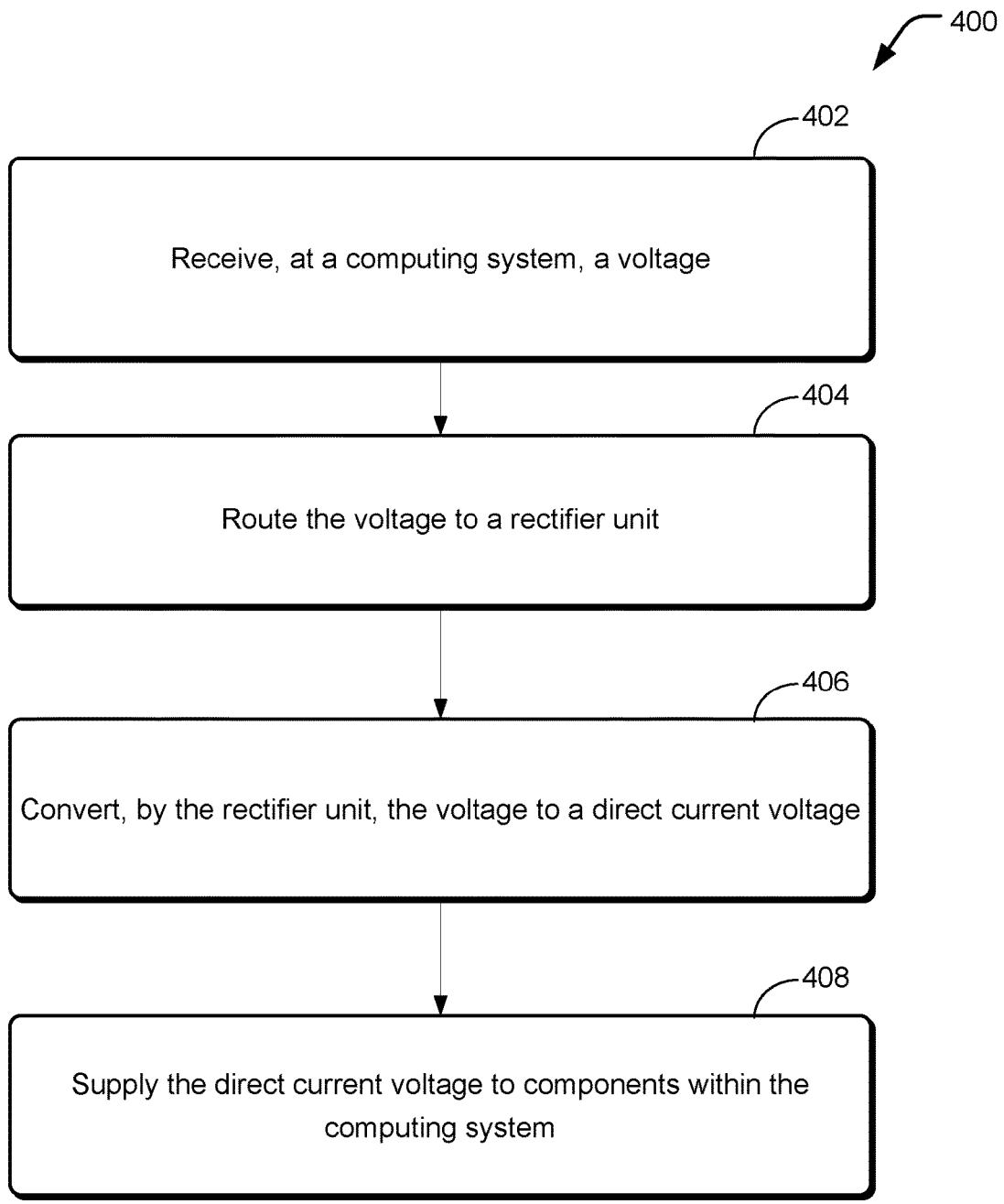
FIG. 4 is a flowchart illustrating an example method of converting power for components within a computing system, in accordance with various embodiments.

FIG. 4 is a flowchart illustrating a method 400 of converting power for components within a computing system, in accordance with various embodiments. As illustrated, at block 402, a voltage is received at the computing system. At 404, the voltage is routed to a rectifier unit. At 406, the rectifier unit converts the voltage to a direct current voltage. At 408, the direct current voltage is supplied to components within the computing system.

Accordingly, the arrangements, techniques, operations and processes disclosed herein provide for single power conversion of 480V 3Φ power that provides increased power for servers, routers and other components in a server cabinet arrangement, when compared to prior arrangements and techniques. The single power conversion provides greater efficiency resulting in minimal power loss when compared to prior arrangements and techniques that utilize multiple power conversions. Such minimal power loss can be as much as 50% less power loss in comparison to prior arrangements and techniques that utilize multiple power conversions. While the arrangements, techniques, operations and processes described herein for single power conversion 480V 3Φ power have been described with respect to servers, routers and other components in a server cabinet arrangement, it is to be understood that the techniques, operations and processes described herein can be used with any type of arrangement that requires a single power conversion of 480V 3Φ power to some other form of power.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

I claim:

1. A system comprising:
a plurality of cabinets, each cabinet of the plurality of cabinets including a housing configured with a plurality of rack units, wherein each rack unit is configured to accept a component;
a plurality of components located within the rack units;
a plurality of overhead power buses located on top of the housings of the plurality of cabinets and configured to receive 480- volt alternating current voltage, wherein a first power bus of the plurality of power buses and a second power bus of the plurality of power buses are electrically coupled to cabinets within a row of cabinets of the plurality of cabinets; and
a plurality of rectifier units configured to receive 480-volt alternating current voltage from the plurality of power buses, wherein each rectifier unit is configured to convert 480-volt alternating current voltage to a direct current voltage to supply to one or more components of the plurality of components, wherein a first cabinet within the row of cabinets includes at least two rectifier units located on opposite sides of the rack units within the first cabinet with respect to a vertical axis of the first cabinet, wherein a first rectifier unit of the at least two rectifier units is electrically coupled to the first power bus to receive 480-volt alternating current voltage from the first power bus, and wherein a second rectifier unit of the at least two rectifier units is electrically coupled to the second power bus to receive 480-volt alternating current voltage from the second power bus.

2. The system of claim 1, further comprising:
a plurality of batteries, wherein the first cabinet within the row of cabinets includes at least one battery located adjacent to at least one rectifier unit within the first cabinet.

3. The system of claim 1, further comprising:
at least two batteries, wherein a first battery of the at least two batteries is located adjacent to the first rectifier unit of the at least two rectifier units and a second battery of the at least two batteries is located adjacent to the second rectifier unit of the at least two rectifier units.

4. The system of claim 3, wherein the first battery is located on a side of the rack units opposite to a side of the rack units where the second battery is located.

5. The system of claim 1, further comprising:
a single battery located external to the plurality of cabinets.

6. The system of claim 5, wherein the single battery is located within a room that houses the system.

7. The system of claim 5, wherein the single battery is located external to a building that houses the system.

8. The system of claim 1, wherein the plurality of rectifier units is configured to convert 480-volt alternating current voltage to one or more of 12 volts direct current, 24 volts direct current, or negative 48 volts direct current.

9. The system of claim 1, wherein at least some of the plurality of components comprise servers.

10. A computing system comprising:
a cabinet, wherein the cabinet includes a housing configured to enclose a plurality of slots;
a plurality of components, wherein each slot includes at least one of the components of the plurality of components;
a first overhead power bus located on top of the housing and configured to receive 480-volt alternating current three phase voltage from a power supply;
a second overhead power bus located on top of the housing and configured to receive 480-volt alternating current three phase voltage from the power supply; and
at least two rectifier units located on opposite sides of the plurality of slots within the cabinet with respect to a vertical axis of the cabinet, wherein a first rectifier unit of the at least two rectifier units is electrically coupled to the first power bus to receive 480-volt alternating current voltage from the first power bus and a second rectifier unit of the at least two rectifier units is electrically coupled to the second power bus to receive 480-volt alternating current voltage from the second power bus, and wherein the at least two rectifier units are configured to convert 480-volt alternating current voltage to a direct current voltage to supply to one or more components of the plurality of components.

11. The computing system of claim 10, further comprising:
at least one battery located adjacent to at least one rectifier unit within the cabinet.

12. The computing system of claim 10, further comprising:
at least two batteries, wherein a first battery of the at least two batteries is located adjacent to the first rectifier unit of the at least two rectifier units and a second battery of the at least two batteries is located adjacent to the second rectifier unit of the at least two rectifier units.

13. The computing system of claim 12, wherein the first battery is located on a side of the slots opposite to a side of the slots where the second battery is located.

14. The computing system of claim 10, further comprising:
   a single battery located external to the cabinet.

15. The computing system of claim 14, wherein the single battery is located within a room that houses the computing system.

16. The computing system of claim 14, wherein the single battery is located external to a building that houses the computing system.

17. The computing system of claim 10, wherein the at least two rectifier units are configured to convert 480-volt alternating current voltage to one or more of 12 volts direct current, 24 volts direct current, or negative 48 volts direct current.

18. The computing system of claim 10, wherein at least some of the plurality of components comprise servers.

\* \* \* \* \*